United States Patent
Seto et al.

(10) Patent No.: US 7,851,867 B2
(45) Date of Patent: Dec. 14, 2010

(54) INTEGRATED CIRCUIT AND METHOD OF MANUFACTURING THE SAME

(75) Inventors: Chinatsu Seto, Toyama (JP); Mikiya Uchida, Kyoto (JP); Kenichi Mimuro, Toyama (JP); Emi Kanazaki, Toyama (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 11/562,126

(22) Filed: Nov. 21, 2006

(65) Prior Publication Data
US 2007/0228495 A1 Oct. 4, 2007

(30) Foreign Application Priority Data
Dec. 6, 2005 (JP) .............................. 2005-352396

(51) Int. Cl.
*H01L 29/76* (2006.01)
(52) U.S. Cl. .................. 257/368; 257/392; 257/402; 257/408; 257/257; 257/344; 257/345; 257/E29.53
(58) Field of Classification Search ................ 257/368, 257/392, 402, 257, 408, 344–345, E29.53
See application file for complete search history.

(56) References Cited

U.S. PATENT DOCUMENTS

| | | | |
|---|---|---|---|
| 5,885,874 A | 3/1999 | Gardner | |
| 5,969,407 A * | 10/1999 | Gardner et al. | 257/607 |
| 5,976,956 A | 11/1999 | Gardner et al. | |
| 6,093,951 A * | 7/2000 | Burr | 257/408 |
| 6,268,256 B1 * | 7/2001 | Kuo | 438/305 |
| 6,281,558 B1 * | 8/2001 | Sayama et al. | 257/391 |
| 2004/0005763 A1 * | 1/2004 | Tseng et al. | 438/305 |
| 2004/0033469 A1 * | 2/2004 | Blacklock | 433/173 |
| 2004/0033649 A1 * | 2/2004 | Noda | 438/197 |

FOREIGN PATENT DOCUMENTS

| | | |
|---|---|---|
| JP | 60-134468 | 7/1985 |
| JP | 11-354785 A | 12/1999 |
| JP | 2000-323587 | 11/2000 |
| JP | 2000-323587 A | 11/2000 |
| JP | 2002-151599 A | 5/2002 |

OTHER PUBLICATIONS

European Search Report, dated Aug. 19, 2008.

* cited by examiner

*Primary Examiner*—Cuong Q Nguyen
*Assistant Examiner*—Trang Q Tran
(74) *Attorney, Agent, or Firm*—Hamre, Schumann, Mueller & Larson, P.C.

(57) ABSTRACT

An integrated circuit includes: a semiconductor substrate that has a well region containing a first conductivity type impurity; and an enhancement type MOS transistor and a plurality of depletion type MOS transistors, each of which is formed in the well region and has a channel region under a gate electrode. At least one of the depletion type MOS transistors has, in the channel region, an implantation region into which a second conductivity type impurity is implanted so that a threshold voltage is adjusted. The implantation region has the first conductivity type impurity and the second conductivity type impurity. Further, the second conductivity type impurity has a concentration that is higher than a concentration of the first conductivity type impurity.

18 Claims, 13 Drawing Sheets

INTEGRATED CIRCUIT AND METHOD OF MANUFACTURING THE SAME

BACKGROUND OF THE INVENTION

1. Field of the Invention

The present invention relates to an integrated circuit, and more specifically relates to an integrated circuit including a plurality of depletion type MOS transistors with varying threshold voltages and a method of manufacturing the same.

2. Description of Related Art

FIG. 7 is a circuit diagram showing a portion of a solid-state imaging device in general use. Photosensitive cells 101, each composed of a photodiode 103, a transfer gate 104, a reset transistor 105 and an amplify transistor 106, are arranged in a matrix form. Each of the photosensitive cells 101 is connected at a contact 109 to a constant-current power supply 108 and to a noise suppressing circuit 102 composed of transistors 111 and 113 and capacitors 112 and 114. The noise suppressing circuit 102 is connected to a horizontal signal line 124 via a horizontal transistor 121 controlled by a horizontal driver circuit 122.

The above-described circuit is a typical circuit of a pixel, and in the circuit, for applications including potential resetting and potential transmission such as performed by the reset transistor 105, the horizontal transistor 121, and the transistors 113 and 123 with respect to a power supply voltage, MOS transistors with varying threshold voltages are used. As such a MOS transistor, generally, a depletion type transistor having a negative threshold voltage is used.

Conventionally, such a depletion type transistor is formed by a method in which an enhancement type transistor with a channel region doped with an impurity is used, and an impurity having conductivity reversed from that of the impurity is introduced into the channel region.

Furthermore, there is a method for controlling threshold voltages of a plurality of transistors by introducing an impurity of a conductivity type (first conductivity type) reversed from that of a second conductivity type substrate into a channel (see, for example, JP 2000-323587 A). In a CMOS semiconductor device composed of a plurality of MOS transistors with varying threshold voltages, first, a second conductivity type well region and a first conductivity type well region are formed on a substrate. Next, a process step of implanting ions into a surface region of the first conductivity type well region is performed so that a first conductivity type impurity layer for threshold voltage control is formed. Then, on a surface region of at least one of the well region in which the first conductivity type impurity layer is formed and the well region in which the first conductivity type impurity layer is not formed, a second conductivity type impurity layer for threshold voltage control is formed by the ion implantation process step. By this manufacturing method, a transistor can be formed with ion implantation performed a number of times fewer than the number of values of the varying threshold voltages.

Furthermore, there is a method for controlling a threshold voltage of a depletion type transistor using arsenic (see, for example, JP 60-134468 A). This method allows a threshold voltage to be controlled by varying an amount of arsenic to be implanted, and thus an extremely high-precision transistor can be obtained that is hardly affected by, for example, processing precision in lithography, dry etching or the like, the intrusion of a field oxide film resulting from a LOCOS method or the like, and the intrusion of a channel stopper.

FIGS. 8A to 8G are cross-sectional views showing as an example process steps of manufacturing a conventional semiconductor device including a depletion type NMOS transistor. A N-channel enhancement type transistor represented by the amplify transistor 106 shown in FIG. 7 is formed in a region A, and a depletion type transistor represented by the reset transistor 105 shown in FIG. 7 is formed in a region B.

First, as shown in FIG. 8A, an element isolation region 144 is formed selectively in a silicon substrate 131. Next, as shown in FIG. 8B, using a resist 151 as a mask, a p-type impurity is implanted so that a p-well region 132 is formed on the silicon substrate 131. Then, similarly, using the same mask (resist 151), a p-type impurity is implanted so that a channel stop layer 133 is formed. Subsequently, using the same mask (resist 151), a p-type impurity is implanted further so that p-type impurity layers 161 and 162 are formed, and the resist 151 is removed.

Next, as shown in FIG. 8C, a resist 154 that covers the region A and has an opening in the region B is pattern-formed. Then, using the resist 154 as a mask, a n-type impurity having conductivity reversed from that of the p-type impurity is implanted into the p-type impurity layer 162 in the region B so that a n-type impurity layer 163 is formed and a threshold voltage of the depletion type transistor is determined. Next, as shown in FIG. 8D, the resist 154 is removed, and an oxide film 156 and polysilicon 157 are formed. Subsequently, a resist 158 is pattern-formed.

Next, using the resist 158 as a mask, the polysilicon 157 and the oxide film 156 are dry-etched and the resist 158 is removed so that, as shown in FIG. 8E, a gate electrode 142 and a gate oxide film 141 are defined. Then, a n-type impurity is implanted so that LDD (Lightly Doped Drain) regions 136 and 137 are formed, thereby defining implantation regions 134 and 135. Subsequently, as shown in FIG. 8F, a gate side-wall insulation film (side-wall insulation film) 143 is formed on side faces of the gate electrode 142.

Next, as shown in FIG. 8G, using the gate electrode 142 and the gate side-wall insulation film 143 as a mask, a n-type impurity is implanted so that source/drain regions 139 and 140 are formed in the LDD regions 136 and 137, respectively.

In the above-described manner, a plurality of MOS transistors with varying threshold voltages can be formed on a common substrate.

Furthermore, in order to obtain an improved characteristic of a solid-state imaging device, it is necessary that a coefficient of fluctuation of a surface potential in a channel region of a depletion type transistor with respect to a gate voltage be increased so that a dynamic range of a floating diffusion 107 is increased. It is desirable that the dynamic range be as large as possible. The dynamic range of the floating diffusion 107 refers to a ratio between a signal obtained when the reset transistor 105 is OFF and a signal obtained when the reset transistor 105 is ON.

Herein, a coefficient of potential fluctuation of a surface potential in a channel region of a depletion type transistor with respect to a gate voltage is defined as a "modulation degree". The modulation degree is one of the indices of the capabilities of a depletion type transistor. FIG. 9 is a band diagram showing depletion of a MOS transistor. A gate voltage VG is divided according to a gate oxide film thickness capacity Cox and a depletion layer capacity Cdep, and therefore, a surface potential $\Phi s$ with respect to a gate voltage is expressed by:

$$\Phi s = [Cox/(Cox+Cdep)] \times VG.$$

The modulation degree refers to a fluctuation amount $\Delta \Phi s$ of the surface potential $\Phi s$ with respect to a fluctuation amount $\Delta VG$ of the gate voltage VG and thus is expressed by:

$$\text{Modulation degree} = \Delta\Phi s/\Delta VG = Cox/(Cox+Cdep) \quad \text{(Equation 1)}.$$

Accordingly, in the case where a surface potential is allowed to fluctuate in accordance with a gate voltage, the modulation degree has a value of 1.

Each of FIGS. 10A and 10B is a diagram showing internal potentials of a source, a gate and a drain in a depletion type transistor in a conducting mode (ON) and in a power cut-off mode (OFF), respectively, in the case where the depletion type transistor is used as, for example, the reset transistor 105 shown in FIG. 7. FIG. 10A shows a case where the modulation degree is high, and FIG. 10B shows a case where the modulation degree is low.

As shown in FIGS. 10A and 10B, each of ΔΦs 1 and ΔΦs 2 indicates a fluctuation amount of a surface potential immediately under a gate with respect to a gate voltage. As shown in FIGS. 10A and 10B, a difference between ΔΦs 1 and ΔΦs 2 produced when the gates are supplied with the same voltage ($VG=V_{on}$) is derived from a difference in modulation degree. When the modulation degree is high, the surface potential has a large fluctuation amount, thereby allowing a surface potential immediately under the gate in the conducting mode to be not higher than a reset potential. In this case, as shown in FIG. 10A, a signal charge 151 that has been stored temporarily in a source region in the power cut-off mode is discharged almost entirely into a drain region, with only a slight amount left in the source region.

On the other hand, when the modulation degree is low, the surface potential has a small value of the fluctuation amount ΔΦs. As shown in FIG. 10B, this causes a surface potential immediately under the gate to be higher than a reset potential, so that a portion of the signal charge 151 failing to exceed the surface potential immediately under the gate results as a residual charge 152.

As the miniaturization of a transistor is advanced with the use of a lower voltage in an integrated circuit and a size reduction of an integrated circuit, there arises a problem that in an enhancement type transistor, punch through occurs in a channel region (especially, in an implantation region) due to a short channel effect to cause a considerable amount of leakage current. With respect to this problem, conventionally, the occurrence of leakage current is suppressed by the formation of a pocket diffusion layer in contact with a source or a drain. Meanwhile, as has been described already with reference to FIG. 7, the transistors such as indicated by 105, 121 and 123 are formed of a depletion type MOS transistor. In the circuit, these transistors function as commonly used switching transistors and thus can be in an off state. Hence, a depletion type MOS also should be formed so as not to cause punch through leakage current due to the short channel effect.

However, the above-described conventional depletion type transistor is formed by the easy method in which a LDD region and a source/drain region are formed simply by the implantation of an impurity having conductivity reversed from the conductivity of a semiconductor substrate and thus is not configured to prevent the occurrence of punchthrough leakage current. Therefore, if a source-drain distance of an implantation region is reduced as a result of the miniaturization of this configuration, punchthrough leakage current is likely to occur.

Furthermore, the above-described conventional depletion type transistor has difficulty in controlling a modulation degree and variations in the modulation degree and also presents a problem that the miniaturization of gate dimensions leads to an increase in variations in threshold voltage.

Variations in threshold voltage are attributable to the formation method in which a first conductivity type impurity and a second conductivity type impurity are introduced simultaneously into an implantation region. Even when the first conductivity type impurity and the second conductivity type impurity are implanted in a ratio of 1:1, these impurities do not necessarily cancel out the influences of each other. This brings about a state in which in one implantation region, an inactive portion of the first conductivity type impurity whose influence has been cancelled out, an inactive portion of the second conductivity type impurity that has cancelled out the influence, a portion of the first conductivity type impurity whose influence has failed to be cancelled out, and an active portion of the second conductivity type impurity that controls a threshold voltage coexist in a mixed state. The portions of the first conductivity type impurity and the second conductivity type impurity that are in an active state vary considerably due to a heat treatment performed during a processing process step and variations in dimensions. The miniaturization of gate dimensions has led to an increasing degree of such variations of these portions.

Furthermore, Equation 1 indicates that a modulation degree depends on a width of a depletion layer in the vicinity of a surface. With the depletion layer having an increased width, the depletion layer capacity Cdep decreases, and the modulation degree increases. That is, the modulation degree increases with increasing width of the depletion layer. However, in the conventional method of forming an implantation region, a second conductivity type impurity is implanted into an implantation region into which a first conductivity type impurity has been implanted, and thus a high-density pn junction is formed in the vicinity of a semiconductor surface, resulting in a decrease in the width of a depletion layer. This makes it difficult to increase the modulation degree. Moreover, for the same reason as described above in regard to variations in threshold voltage, it also is difficult to control variations in modulation degree.

While describing a method by which the problem of a manufacturing cost can be solved, JP 2000-323587 A makes no mention of these variations and thus hardly can solve the above-described problems. Furthermore, the structure described in JP 60-134468 A hardly can solve the above-described problems that have become more serious as miniaturization advances.

SUMMARY OF THE INVENTION

It is an object of the present invention to provide an integrated circuit that includes both of enhancement type MOS transistors and depletion type MOS transistors, in which the depletion type MOS transistors have a high modulation degree and achieve reductions in variations in threshold voltage and the modulation degree; a solid-state imaging device including the integrated circuit; and methods of manufacturing the integrated circuit and the solid-state imaging device.

In order to achieve the above-described object, a first integrated circuit according to the present invention includes: a semiconductor substrate that has a well region containing a first conductivity type impurity; and an enhancement type MOS transistor and a plurality of depletion type MOS transistors, each of which is formed in the well region and has a channel region under a gate electrode. In the integrated circuit, at least one of the depletion type MOS transistors has, in the channel region, an implantation region into which a second conductivity type impurity is implanted so that a threshold voltage is adjusted. The implantation region has the first conductivity type impurity and the second conductivity type impurity. Further, the second conductivity type impurity has a concentration that is higher than a concentration of the first conductivity type impurity.

In order to achieve the above-described object, a second integrated circuit according to the present invention includes: a semiconductor substrate that has a well region containing a first conductivity type impurity; and an enhancement type MOS transistor and a plurality of depletion type MOS transistors, each of which is formed in the well region and has a channel region under a gate electrode. In the integrated circuit, at least one of the depletion type MOS transistors has, in the channel region: an implantation region into which a second conductivity type impurity is implanted so that a threshold voltage is adjusted; and a first conductivity type pocket implantation region formed under the implantation region. The implantation region has a concentration of the second conductivity type impurity that is higher than a concentration of the first conductivity type impurity. The second conductivity type impurity is implanted to a depth shallower than a depth at which the pocket implantation region is formed.

A solid-state imaging device according to the present invention includes either of the above-described first and second integrated circuits.

In order to achieve the above-described object, a first method of manufacturing an integrated circuit according to the present invention is a method of manufacturing an integrated circuit including an enhancement type MOS transistor and a plurality of depletion type MOS transistors that are formed on a semiconductor substrate having a well region containing a first conductivity type impurity. The method includes, with respect to at least one of the depletion type MOS transistors: implanting a second conductivity type impurity into the well region so as to form a second conductivity type implantation region; forming a gate electrode on the implantation region; and implanting, using the gate electrode as a mask, a second conductivity type impurity into the semiconductor substrate so as to form drain and source regions.

In order to achieve the above-described object, a second method of manufacturing an integrated circuit according to the present invention is a method of manufacturing an integrated circuit including an enhancement type MOS transistor and a plurality of depletion type MOS transistors that are formed on a semiconductor substrate having a well region containing a first conductivity type impurity. The method includes, with respect to at least one of the depletion type MOS transistors: implanting a first conductivity type impurity into the well region; implanting a second conductivity type impurity heavier than the first conductivity type impurity into the well region into which the first conductivity type impurity has been implanted so as to form a second conductivity type implantation region; forming a gate electrode on a portion of the implantation region; implanting, using the gate electrode as a mask, a first conductivity type impurity under the implantation region so as to form a pocket region; and implanting, using the gate electrode as a mask, a second conductivity type impurity into a portion of the implantation region on which the gate electrode is not formed so as to form drain and source regions.

In order to achieve the above-described object, a method of manufacturing a solid-state imaging device according to the present invention uses the above-described method of manufacturing an integrated circuit.

DETAILED DESCRIPTION OF THE INVENTION

Figure 1A:
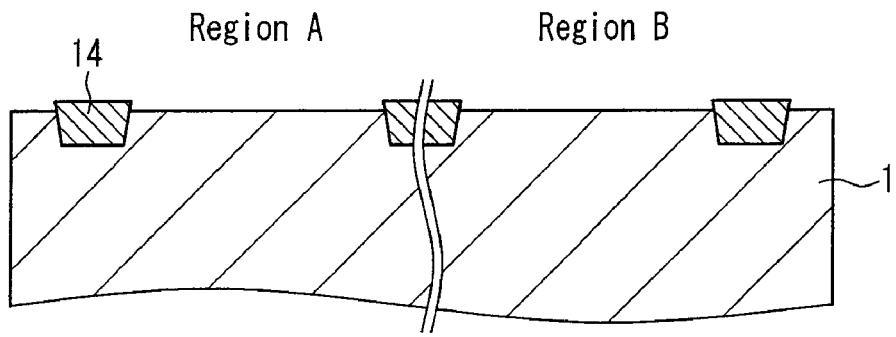
FIGS. 1A to 1I are cross-sectional views showing process steps of manufacturing an integrated circuit according to Embodiment 1 of the present invention.

Variations in the threshold voltage of a MOS transistor are attributable to the formation method in which a first conductivity type impurity and a second conductivity type impurity are introduced simultaneously into an implantation region in a channel. Even when the first conductivity type impurity and the second conductivity type impurity are implanted in a ratio of 1:1, these impurities do not necessarily cancel out the influences of each other. This brings about a state in which in one implantation region, an inactive portion of the first conductivity type impurity whose influence has been cancelled out, an inactive portion of the second conductivity type impurity that has cancelled out the influence, a portion of the first conductivity type impurity whose influence has failed to be cancelled out, and an active portion of the second conductivity type impurity that controls a threshold voltage coexist in a mixed state. The portions of the first conductivity type impurity and the second conductivity type impurity that are in an active state vary considerably due to a heat treatment performed during a processing process step and variations in dimensions.

According to the first integrated circuit of the present invention, there is no possibility that in one transistor, a first conductivity type impurity layer and a second conductivity type impurity layer that is active and inherently intended to control a threshold voltage coexist in a mixed state in a channel region, thereby allowing variations in threshold voltage to be reduced.

The width of a depletion layer is expressed by the following equations:

$$W = [2 \in_s \{(N_A + N_D)/N_A N_D\} V b i]^{1/2}$$

$$Vbi = kT \ln(N_A N_D / n_i^2)$$

where $\in_s$: a dielectric constant of a semiconductor substrate, $N_A$: a concentration of an acceptor (P-type) impurity, $N_D$: a concentration of a donor (N-type) impurity, and $n_i$: a carrier concentration of an intrinsic semiconductor.

As indicated by the above equations, when a threshold voltage is controlled by a method employed in the present invention, in which a low concentration of $N_D$ is introduced into a well or a substrate having a low concentration of $N_A$ so as to cancel out the influence of $N_A$, the width W of a depletion layer becomes larger than in the case of employing a conventional method in which a comparatively high concentration of $N_A$ is introduced into a channel region and then the influence of $N_A$ is cancelled out by using a comparatively high concentration of $N_D$. In the first integrated circuit of the present invention, there is no possibility that in one transistor, a first conductivity type impurity layer coexists in a mixed state with a second conductivity type impurity layer that is active and inherently intended to control a threshold voltage, thereby allowing a channel to have a lower impurity concentration than in a conventional case. This can achieve an increase in the size of a depletion layer, and thus a modulation degree can be increased.

Furthermore, a configuration also is possible in which a first conductivity type pocket implantation region is provided in the channel region, which is formed under the implantation region so as to suppress the occurrence of punchthrough, and the second conductivity type impurity is implanted to a depth shallower than a depth at which the pocket implantation region is formed.

Furthermore, a configuration also is possible in which the second conductivity type impurity implanted into the channel region is phosphorus.

Furthermore, a configuration also is possible in which the second conductivity type impurity implanted into the channel region is arsenic.

According to the second integrated circuit of the present invention, an implantation region contains a first conductivity type impurity and a second conductivity type impurity, and thus there coexist an inactive portion of the first conductivity type impurity whose influence has been cancelled out, an inactive portion of the second conductivity type impurity that has cancelled out the influence, a portion of the first conductivity type impurity whose influence has failed to be cancelled out, and an active portion of the second conductivity type impurity that is inherently intended to control a threshold voltage. However, as the second conductivity type impurity, a type of ions heavier than ions of the first conductivity type impurity is used, and thus a range of Rp (flying distance) of implanted ions and a coefficient of ion diffusion caused by a heat treatment are decreased, thereby allowing variations to be reduced further. Further, a pn junction is formed in a position at a decreased depth, and thus a distance between a gate electrode and a depletion layer is decreased, thereby allowing the influence of a voltage drop caused by a parasitic resistance to be reduced. This increases a modulation degree.

Furthermore, it is preferable to have a configuration in which the first conductivity type impurity is boron and the second conductivity type impurity is arsenic.

Furthermore, a configuration also is possible in which the plurality of depletion type MOS transistors include a depletion type MOS transistor different from others in threshold voltage.

According to the first method of manufacturing an integrated circuit of the present invention, a first conductivity type impurity is not implanted into a channel region for any purpose other than when forming a well. Thus, variations in threshold voltage of a gate can be reduced.

Furthermore, after the gate electrode is formed, using the gate electrode as a mask, a first conductivity type impurity may be implanted under the implantation region so that a pocket region is formed.

According to the second method of manufacturing an integrated circuit of the present invention, as the second conductivity type impurity to be implanted into a channel region, a type of ions heavier than ions of the first conductivity type impurity is used. Therefore, the depth to which the second conductivity type impurity is implanted can be decreased, and thus the influence of a voltage drop caused by a parasitic resistance can be reduced, thereby allowing a modulation degree to be increased. Further, the second conductivity type impurity is of the heavy ion type and thus is hardly diffused, thereby allowing variations in threshold voltage and variations in modulation degree with respect to a gate voltage to be suppressed.

Furthermore, it also is possible that, after the gate electrode is formed, using the gate electrode as a mask, a first conductivity type impurity is implanted under the implantation region so that a pocket region is formed.

Hereinafter, embodiments of an integrated circuit (transistor) in a solid-state imaging device according to the present invention will be described with reference to the appended drawings.

Embodiment 1

The description is directed first to a structure of an integrated circuit according to Embodiment 1 of the present invention. The integrated circuit according to this embodiment is a hybrid circuit as a combination of an analog circuit and a digital circuit, each including a plurality of enhancement type and depletion type transistors with varying threshold voltages.

Figure 1B:
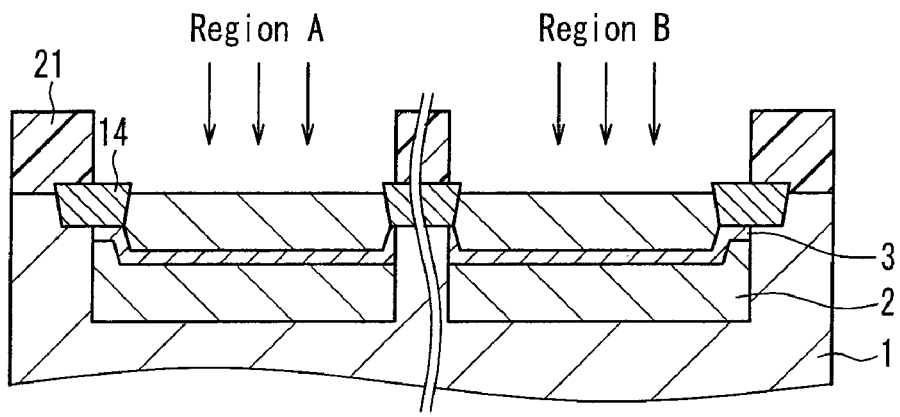
Figure 1C:
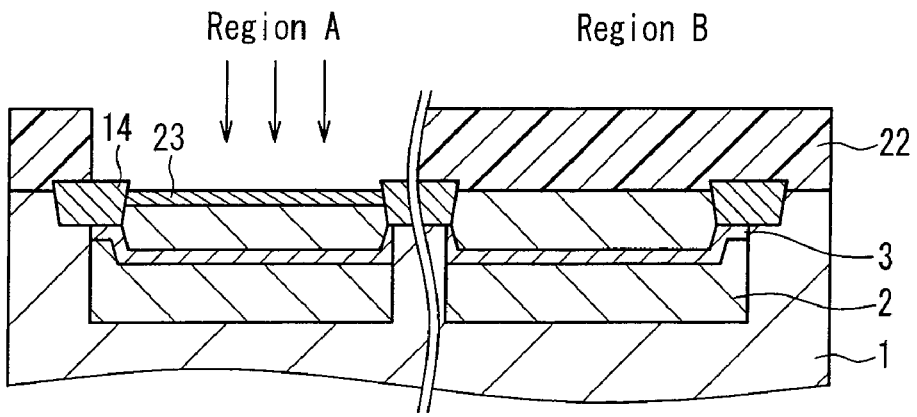
Figure 1D:
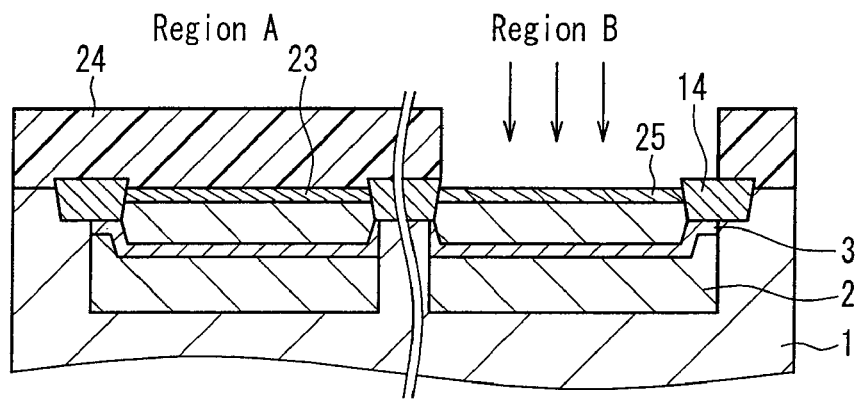
Figure 1E:
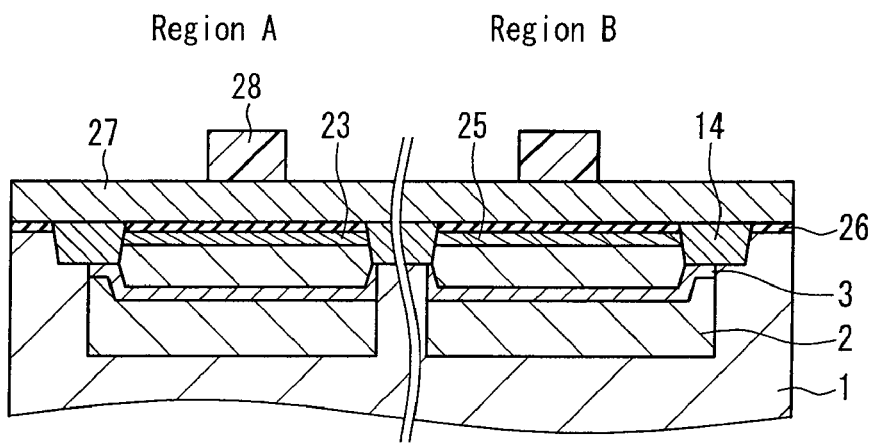
Figure 1F:
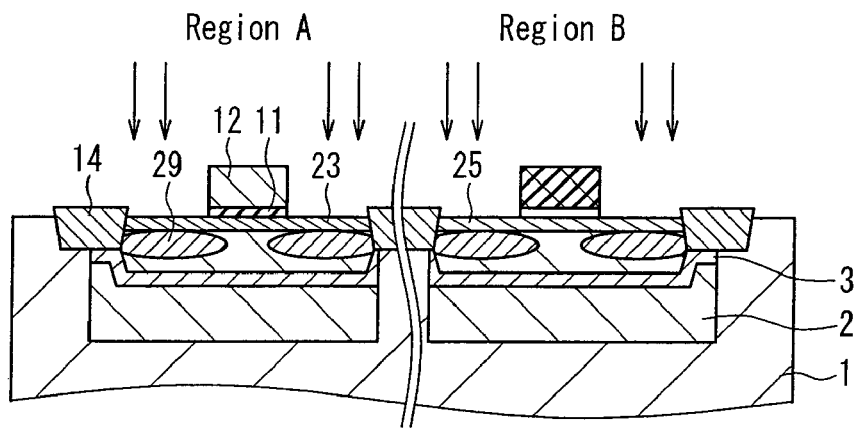
Figure 1G:
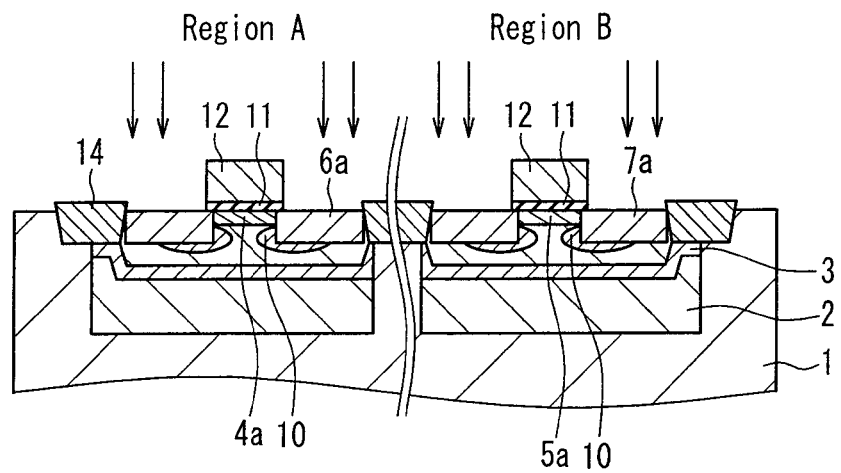
Figure 1H:
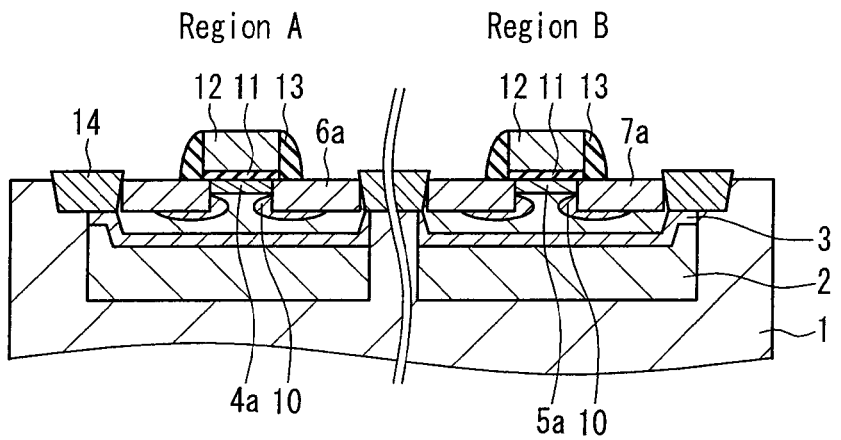
Figure 1I:
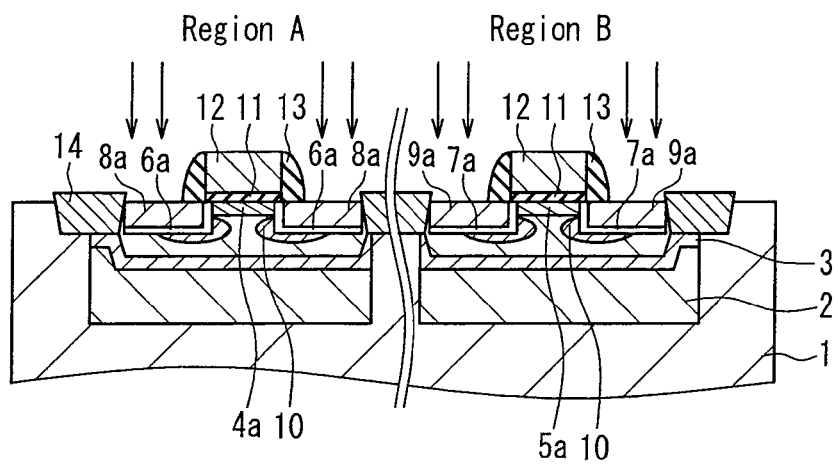

FIG. 1I is a cross-sectional view of the integrated circuit according to this embodiment. A N-channel enhancement type transistor is formed in a region A, and a depletion type transistor is formed in a region B.

Element isolation regions 14 are formed in a silicon substrate 1, and a p-well region 2 is formed in a region between each pair of adjacent ones of the element isolation regions 14. A channel stop region 3 is formed in the p-well regions 2. Each of implantation regions 4a and 5a is formed on a surface of the p-well region 2 between the element isolation regions 14, and LDD (Lightly Doped Drain) regions 6a and 7a are formed on both sides of the implantation regions 4a and 5a, respectively. Source/drain regions 8a and 9a are formed in the LDD regions 6a and 7a, respectively, and under the implantation regions 4a and 5a, pocket implantation regions 10 are formed in contact with the LDD regions 6a and 7a, respectively.

A gate electrode 12 is formed on each of the implantation regions 4a and 5a via a gate oxide film 11. A region under the gate electrode 12 in which each of the implantation regions 4a and 5a and the pocket implantation region 10 are formed defines a channel region. A gate side-wall insulation film (side-wall insulation film) 13 is formed on side faces of the gate electrode 12.

The description is directed next to a method of manufacturing the above-described integrated circuit. FIGS. 1A to 1I are cross-sectional views showing process steps of manufacturing the integrated circuit according to this embodiment.

First, as shown in FIG. 1A, the element isolation region 14 is formed selectively in the silicon substrate 1. Next, as shown in FIG. 1B, a resist 21 is pattern-formed, and using the resist 21 as a mask, a p-type impurity (first conductivity type impurity) is implanted into the silicon substrate 1 so that the p-well region 2 is formed. Then, using the same mask (resist 21), a p-type impurity is implanted again so that the channel stop region 3 is formed in the p-well region, and the resist 21 is removed. Next, as shown in FIG. 1C, a resist 22 that covers the region B and has an opening in the region A is pattern-formed. Then, using the resist 22 as a mask, a p-type impurity is implanted into a surface region so that a p-type impurity layer 23 is formed, thereby determining a threshold voltage of the N-channel transistor. After that, the resist 22 is removed.

Next, as shown in FIG. 1D, a resist 24 that covers the region A and has an opening in the region B is pattern-formed. Using the resist 24 as a mask, a n-type impurity (second conductivity type impurity) is implanted into the region B so that a n-type impurity layer 25 is formed, thereby controlling a threshold voltage of the depletion type transistor. The n-type impurity is implanted to a depth shallower than a depth at which the pocket implantation region 10 is to be formed. After that, the resist 24 is removed.

Next, as shown in FIG. 1E, an oxide film 26 is formed on a surface of the substrate, and polysilicon 27 is deposited on the oxide film 26. Next, a resist 28 is pattern-formed on the polysilicon 27. Then, using the resist 28 as a mask, as shown in FIG. 1F, the gate electrode 12 and the gate oxide film 11 are defined by dry etching. Subsequently, using the gate electrode 12 and the element isolation region 14 as a mask, a p-type impurity is implanted so that an implantation region 29 is formed. Moreover, as shown in FIG. 1G, a n-type impurity is implanted so that the LDD regions 6a and 7a are formed, thereby defining the pocket implantation region 10 and the implantation regions 4a and 5a. In this case, the n-type impurity is implanted to a depth shallower than a depth of a region in which the pocket implantation region 10 (see FIG. 1I) is formed. This is because, if the concentration of the implanted n-type impurity coincides with the concentration of the p-type impurity at a depth within the pocket implantation region 10, punchthrough is more likely to occur.

Next, as shown in FIG. 1H, the gate side-wall insulation film (side-wall insulation film) 13 is formed on the side faces of the gate electrode 12. Then, as shown in FIG. 1I, using the gate electrode 12, the gate side-wall insulation film 13 and the element isolation region 14 as a mask, a n-type impurity is implanted so that source/drain regions 8a and 9a are formed in the LDD regions 6a and 7a, respectively.

In this manner, the N-channel enhancement type transistor and the depletion type transistor are formed on a common substrate.

By the above-described manufacturing method, an integrated circuit including transistors that achieve a reduction in variations in threshold voltage can be manufactured. Further, a depletion layer can be formed so as to have an increased width, thereby allowing a modulation degree to be increased.

By varying the concentration of the p-type impurity or the n-type impurity implanted as shown in FIG. 1C or FIG. 1D, it is possible to form transistors with varying threshold voltages.

Figure 2:
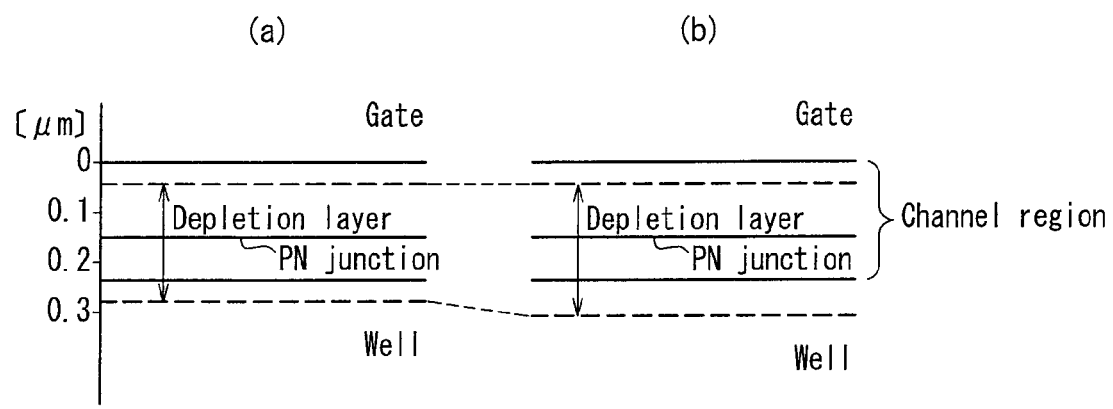
FIG. 2 is a diagram showing a simulation result in which a depletion layer is compared between a transistor according to Embodiment 1 and a conventional transistor.

FIG. 2 is a diagram showing a simulation result regarding a depletion layer of a transistor. FIG. 2(a) shows a transistor as a conventional example formed by a method in which as the n-type impurity of the implantation region 5a, phosphorus is implanted into a boron-implanted region, and FIG. 2(b) shows the transistor of this embodiment.

In this simulation, a dose amount is adjusted so that a depletion type transistor has a threshold voltage Vt=−1.00 V. As implantation conditions, an implantation energy is set to 35 keV for (a) the conventional transistor and to 25 keV for (b) the transistor according to this embodiment.

A comparison between FIGS. 2(a) and 2(b) indicates that a depletion layer of (b) is slightly wider than a depletion layer of (a). Based on this, it can be found that the transistor according to this embodiment has a higher modulation degree compared with that of the transistor as the conventional example.

Figure 3:
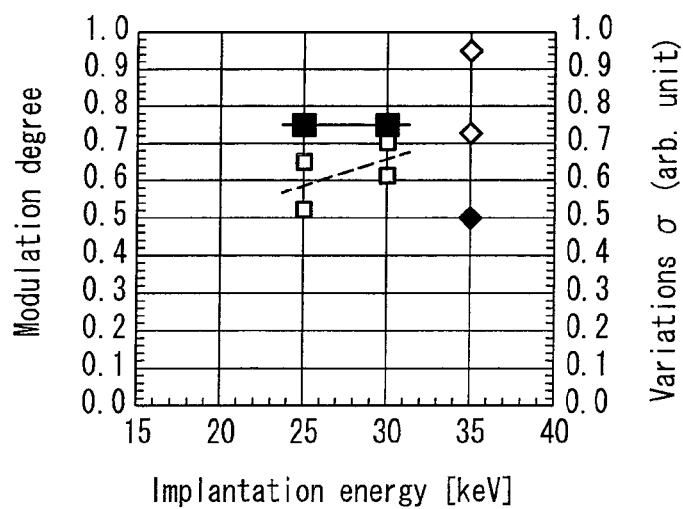
FIG. 3 is a graph showing experimental results regarding a modulation degree and variations in the modulation degree of each of the conventional depletion type transistor and the depletion type transistor of the embodiment.

Furthermore, FIG. 3 shows experimental results regarding a modulation degree and variations in the modulation degree of each of the conventional depletion type transistor and the depletion type transistor of this embodiment. In FIG. 3, a horizontal axis indicates an implantation energy of an impurity to be implanted into a channel region, and a vertical axis on the left indicates a modulation degree, while a vertical axis on the right indicates variations in the modulation degree. In FIG. 3, ■ indicates a modulation degree in this embodiment, ♦ indicates a modulation degree of the conventional example, □ indicates variations in the modulation degree in this embodiment, and ◇ indicates variations in the modulation degree of the conventional example. Values on the axis indicating the variations in the modulation degree are arbitrary. As the phosphorus implantation energy decreases, the variations decrease while the modulation degree does not change. The variations described herein are expressed in terms of a standard deviation.

In this experiment, a dose amount is set so that the depletion type transistors have a threshold voltage Vt=−1.21 V. As implantation conditions, an implantation energy is set at 35 keV for the conventional transistor and at 25 keV or 30 keV for the transistor according to this embodiment.

The results shown in FIG. 3 are obtained by measurements performed with respect to two samples of the depletion type transistor according to this embodiment, and in the results, the modulation degree is shown using a median of respective values of the two samples, and the variations are shown by a broken line indicating a mean value of respective values of the two samples. As can be seen from FIG. 3, the transistor according to this embodiment has a modulation degree of 0.75 (at an implantation energy of 25 keV) and thus achieves an about 1.5-fold increase in the modulation degree compared with the transistor as the conventional example having a modulation degree of 0.5 (at an implantation energy of 35 keV). Further, as for the variations, the transistor according to this embodiment has a value of 0.58 (at an implantation energy of 25 keV) and thus achieves an about 0.69-fold suppression compared with the transistor as the conventional example having a value of 0.84 (at an implantation energy of 35 keV).

The above-described transistor has a high modulation degree and achieves a reduction in variations, thereby allowing a solid-state imaging element including this transistor to have an increased dynamic range of a floating diffusion.

Furthermore, the variations in modulation degree can be suppressed, thereby allowing variations in threshold voltage also to be suppressed. Further, by the use of this transistor, it is possible to form a solid-state imaging device that achieves a size reduction and high integration.

Furthermore, the pocket implantation 10 is formed in a position deeper than a position of the LDD regions 6a and 7a, and thus the occurrence of punchthrough can be prevented.

In the integrated circuit according to this embodiment, phosphorus was used as the impurity for the channel region of the depletion type transistor. However, as the impurity, arsenic also can be used.

Embodiment 2

In an integrated circuit according to Embodiment 2 of the present invention, as an impurity with which an implantation region is doped, an impurity heavier compared with the case of a conventional transistor is used, and thus the integrated circuit suppresses diffusion, achieves an improvement in modulation degree and suppresses variations in the modulation degree.

The description is directed first to a structure of the integrated circuit according to this embodiment. FIG. 4H is a cross-sectional view of the integrated circuit according to this embodiment. The implantation region 5a in the depletion type transistor shown in regard to Embodiment 1 is replaced by an implantation region 5b containing a p-type impurity and a n-type impurity. Further, boron is used as the p-type impurity, and arsenic heavier than phosphorus is used as the n-type impurity.

The integrated circuit according to this embodiment includes depletion type NMOS transistors with a plurality of threshold voltages, and the threshold voltage of at least one of the transistors is controlled through implantation amounts of both of the p-type impurity and the n-type impurity.

The integrated circuit according to this embodiment has the same structure as that of the integrated circuit according to Embodiment 1 except that a different material is used for forming implantation regions 4b and 5b, LDD regions 6b and 7b and source/drain regions 8b and 9b. Other constituent elements are indicated by the same reference characters as in Embodiment 1, and duplicate descriptions thereof are omitted.

The description is directed next to a method of manufacturing the above-described transistor. FIGS. 4A to 4H are cross-sectional views showing process steps regarding the integrated circuit according to this embodiment. A region A indicates a n-channel enhancement type transistor, and a region B indicates a depletion type transistor.

Figure 4A:
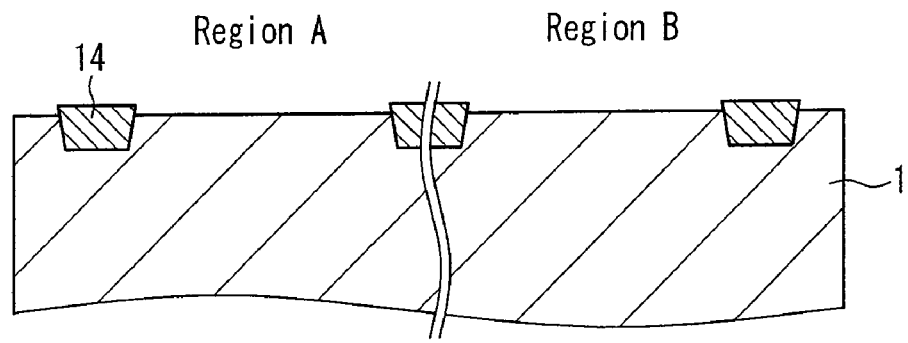
FIGS. 4A to 4H are cross-sectional views showing process steps of manufacturing an integrated circuit according to Embodiment 2 of the present invention.
Figure 4B:
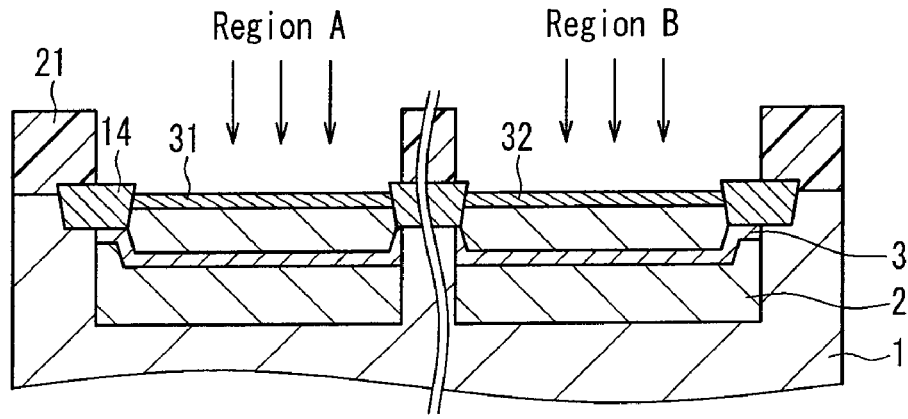

First, as shown in FIG. 4A, an element isolation region 14 is formed selectively in a silicon substrate 1. Next, as shown in FIG. 4B, a resist 21 is pattern-formed. Using the resist 21 as a mask, boron that is a p-type impurity (first conductivity type impurity) is implanted into the silicon substrate 1 so that a p-well region 2 is formed. Then, using the resist 21 as a mask, boron is implanted again so that a channel stop region 3 is formed. Subsequently, using the resist 21 as a mask, boron is implanted further so that p-type impurity layers 31 and 32 are formed, thereby determining a threshold voltage of the n-channel transistor. After that, the resist 21 is removed.

Figure 4C:
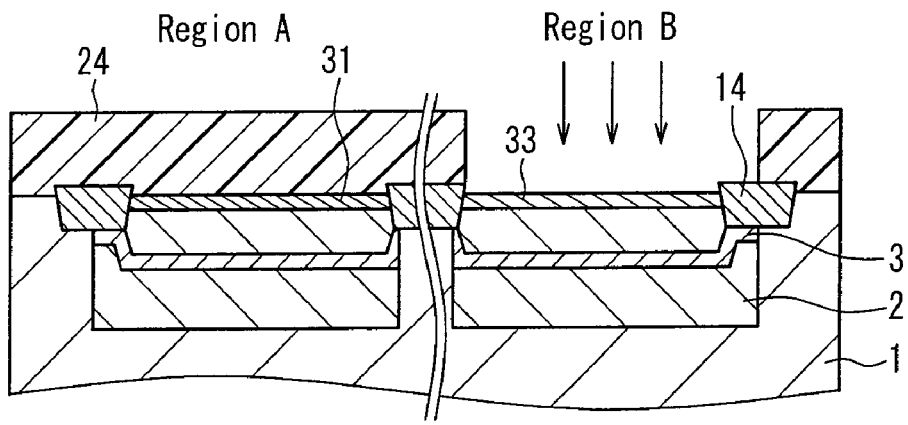

Next, as shown in FIG. 4C, a resist 24 that covers the region A and has an opening in the region B is pattern-formed. Using the resist 24 as a mask, arsenic that is a n-type impurity (second conductivity type impurity) is implanted into the p-type impurity layer 32 in the region B so that an impurity layer 33 is formed, thereby controlling a threshold voltage of the depletion type transistor. In this case, the n-type impurity is implanted to a depth shallower than a depth at which a pocket implantation region 10 is to be formed. After that, the resist 24 is removed.

Figure 4D:
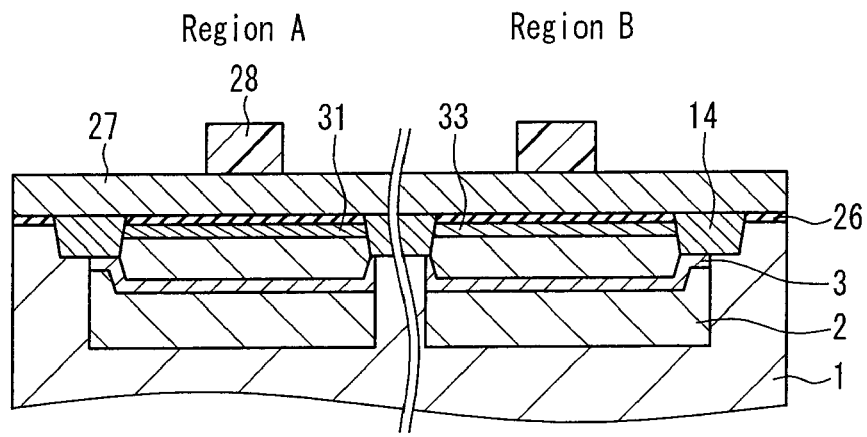
Figure 4E:
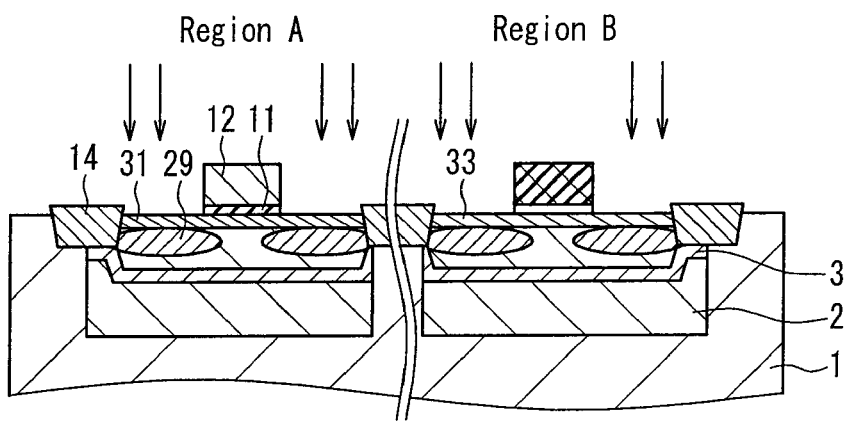
Figure 4F:
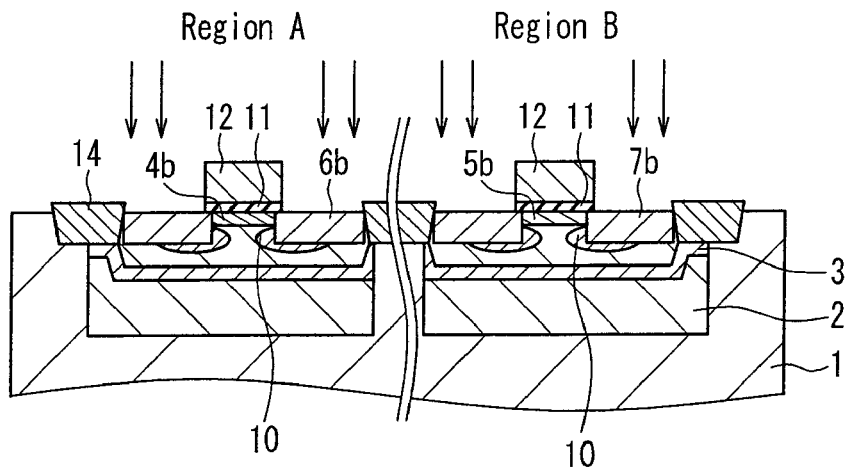

Next, as shown in FIG. 4D, an oxide film 26 and polysilicon 27 are deposited on the p-well region 2. Then, a resist 28 is pattern-formed on the polysilicon 27, and using the resist 28 as a mask, as shown in FIG. 4E, a gate electrode 12 and a gate oxide film 11 are defined by dry etching. Subsequently, using the gate electrode 12 and the element isolation region 14 as a mask, a p-type impurity is implanted so that an implantation region 29 is formed. Moreover, as shown in FIG. 4F, a n-type impurity is implanted so that implantation regions 4b and 5b and the pocket implantation region 10 are defined and LDD regions 6b and 7b are formed.

In this case, the n-type impurity for forming the LDD regions 6b and 7b are implanted to a depth shallower than a depth of a region in which the pocket implantation region 10 is formed. This is because, if the pocket implantation region 10 and the LDD regions 6b and 7b are positioned at substantially the same depth, the n-type impurity electrically cancels out the influence of the p-type impurity to decrease the effective concentration of the p-type impurity, so that punchthrough is more likely to occur.

Figure 4G:
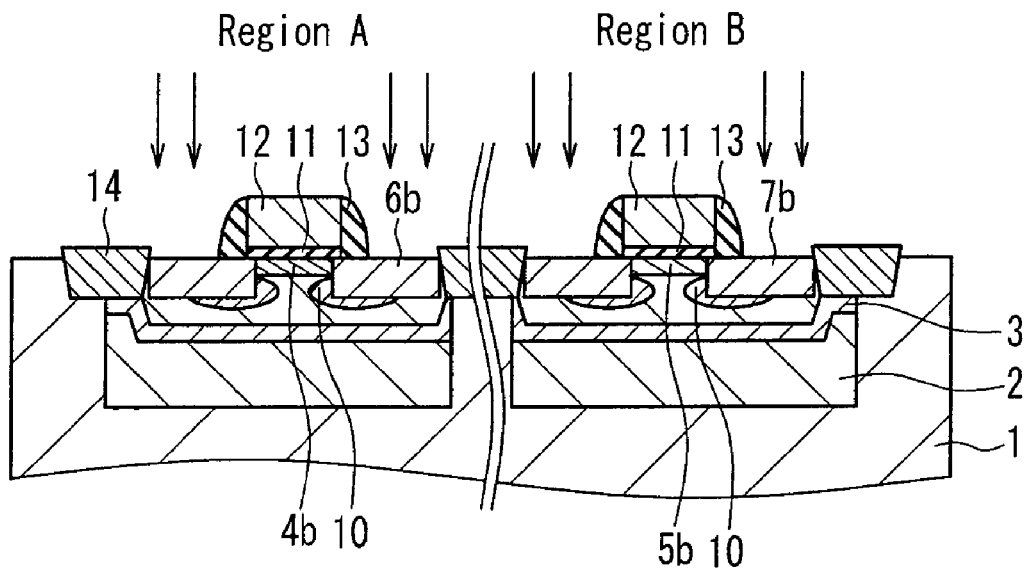
Figure 4H:
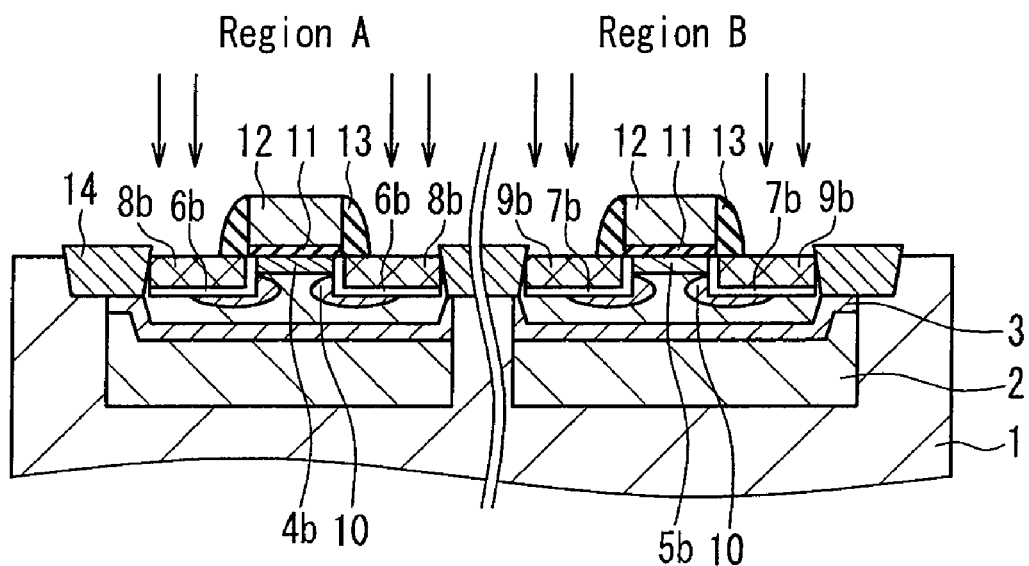

Next, as shown in FIG. 4G, a gate side-wall insulation film (side-wall insulation film) 13 is formed on side faces of the gate electrode 12. Further, as shown in FIG. 4H, using the gate electrode 12, the gate side-wall insulation film 13 and the element isolation region 14 as a mask, a n-type impurity is implanted so that source/drain regions 8b and 9b are formed.

The method of manufacturing the integrated circuit according to this embodiment is performed as described above, and thus the pocket implantation region 10 is formed in a position deeper than a position of the LDD regions 6b and 7b, thereby allowing the occurrence of punchthrough to be prevented. Further, variations in the threshold value of a transistor can be reduced. Further, a depletion layer can be formed so as to have an increased width, thereby allowing a modulation degree to be increased.

Figure 5:
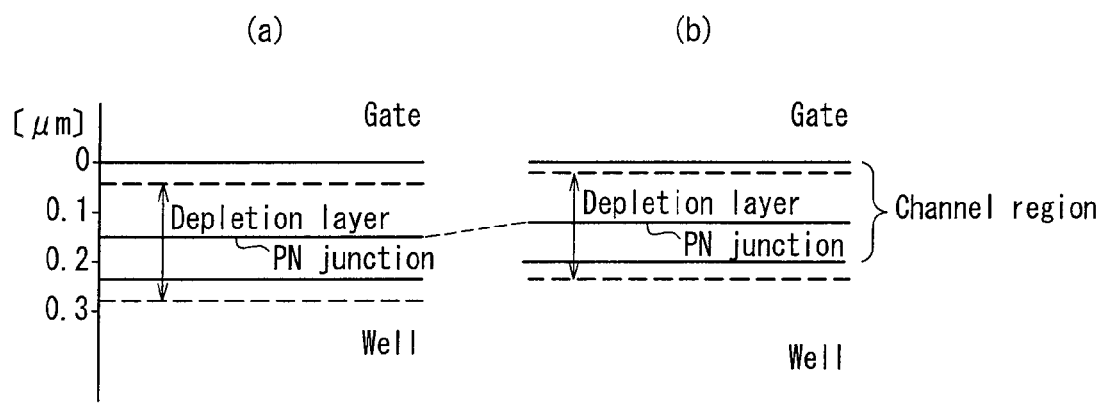
FIG. 5 is a diagram showing a simulation result in which a depletion layer is compared between a transistor according to Embodiment 2 and a conventional transistor.

FIG. 5 is a diagram showing a simulation result regarding a depletion layer in (a) a transistor as a conventional example that uses boron as the p-type impurity and phosphorus as the n-type impurity and (b) the transistor of this embodiment that uses boron as the p-type impurity and arsenic as the n-type impurity.

In this simulation, a dose amount is adjusted so that a depletion type transistor has a threshold voltage Vt=−1.00 V. For example, as implantation conditions, phosphorus ions are implanted and an implantation energy is set to 35 keV for (a) the transistor as the conventional example, and arsenic ions are implanted and an implantation energy is set to 90 keV for (b) the transistor according to this embodiment.

A comparison between FIGS. 5(a) and 5(b) indicates that a pn junction is positioned at a shallower depth in (b). That is, in the case where the arsenic ions are implanted, as a result, an impurity implantation layer is formed at a decreased depth, and an impurity concentration increases. Therefore, a parasitic resistance in a channel region is decreased, and thus it becomes easier for a gate voltage to be transmitted through a portion of the channel region immediately under the gate electrode.

Figure 6:
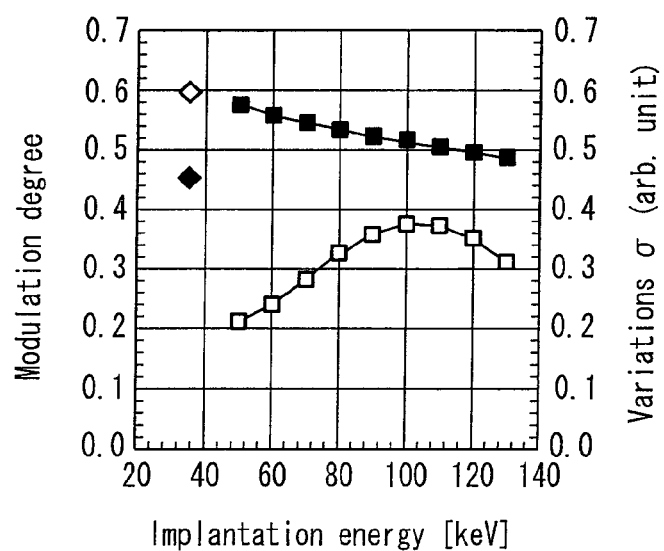
FIG. 6 is a graph showing experimental results regarding a modulation degree measured with respect to each of the transistor according to Embodiment 2 and the conventional transistor.
Figure 7:
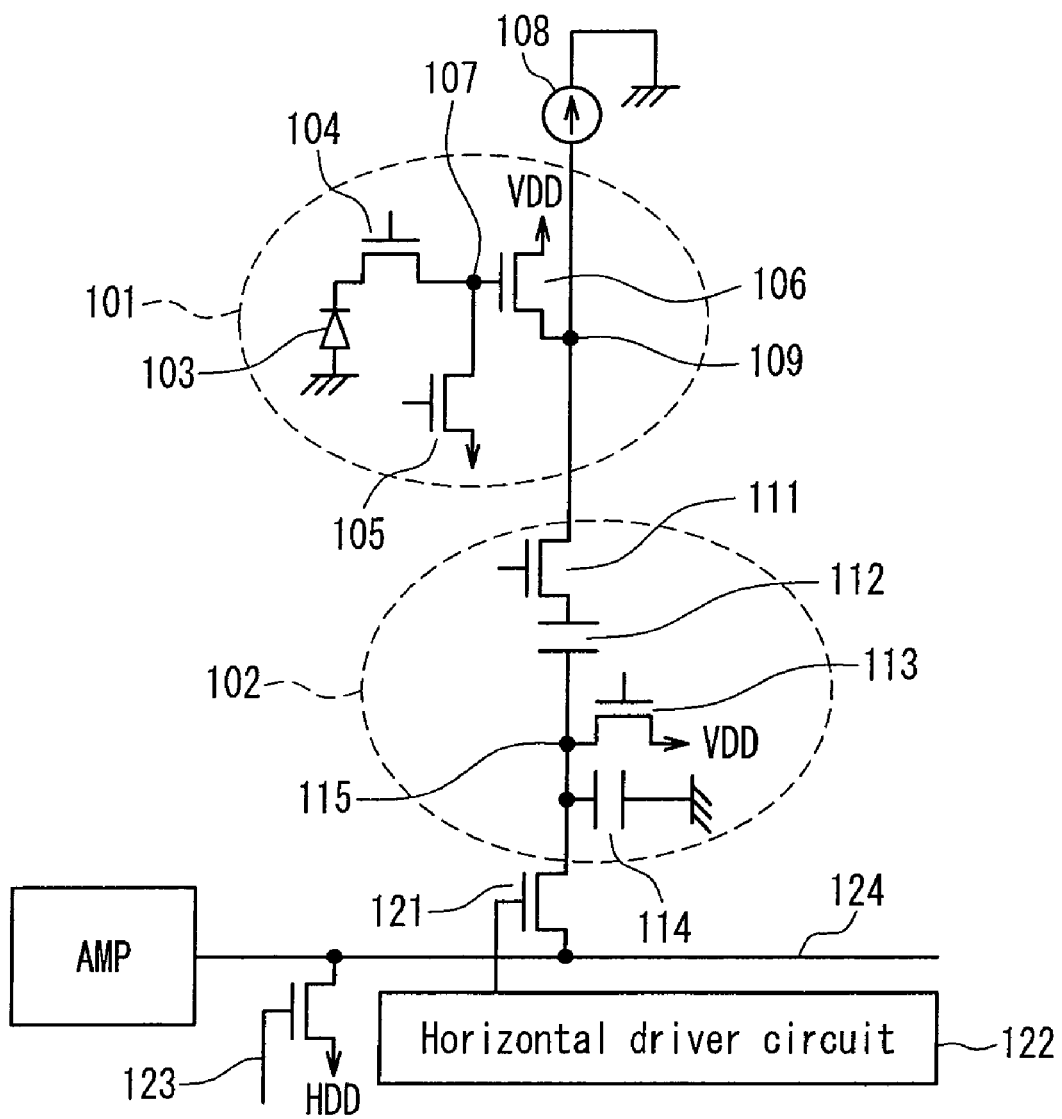
FIG. 7 is a circuit diagram showing a photosensitive cell and a noise control circuit in a conventional solid-state imaging device.
Figure 8A:
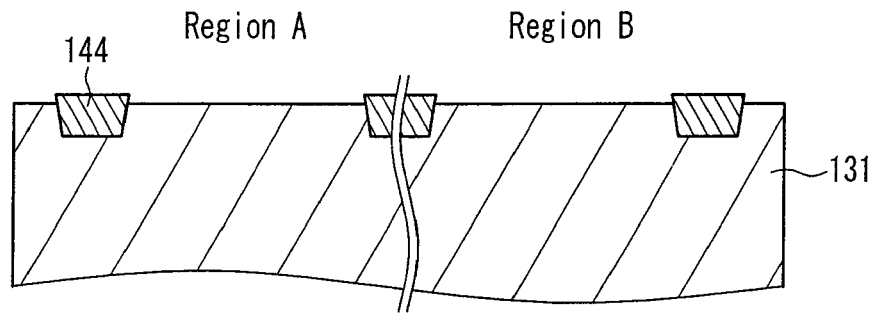
FIGS. 8A to 8G are cross-sectional views showing process steps of manufacturing a conventional integrated circuit.
Figure 8B:
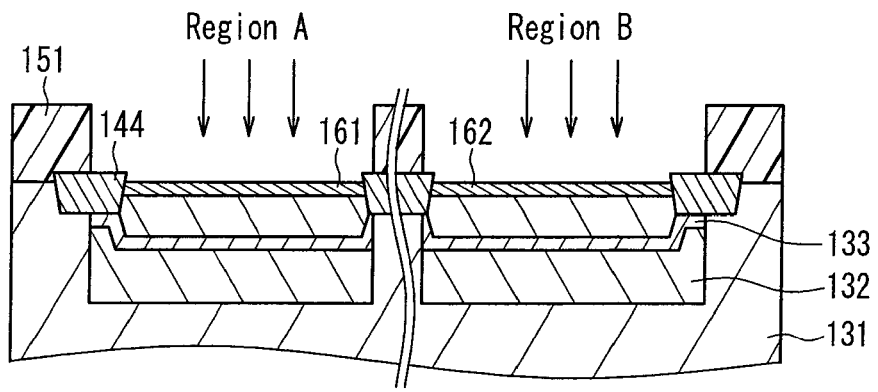
Figure 8C:
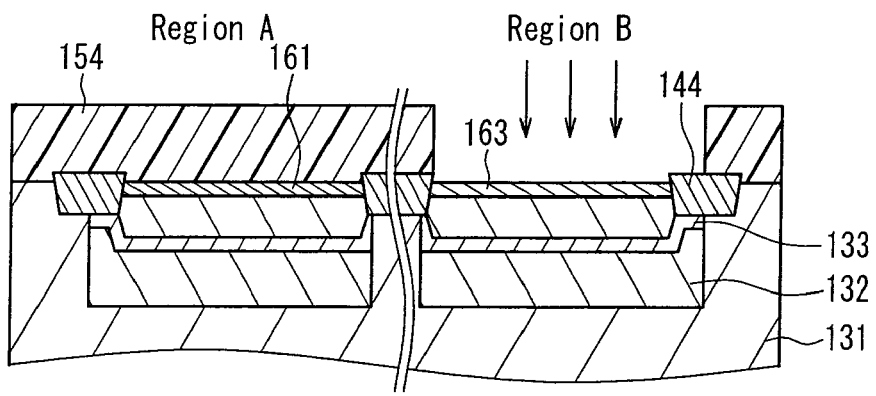
Figure 8D:
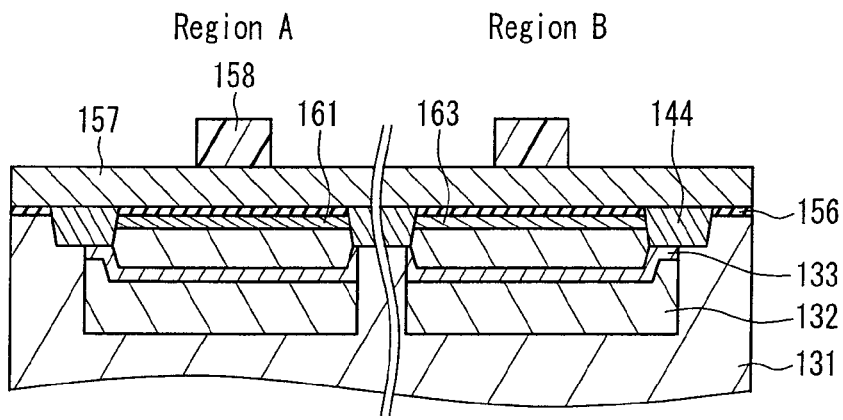
Figure 8E:
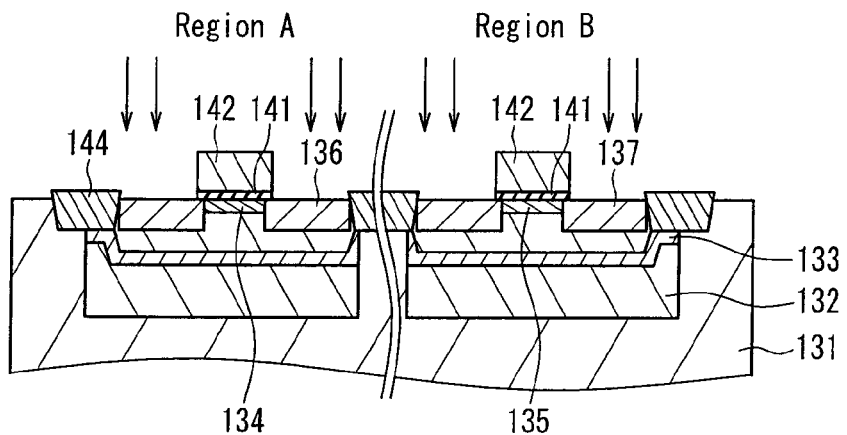
Figure 8F:
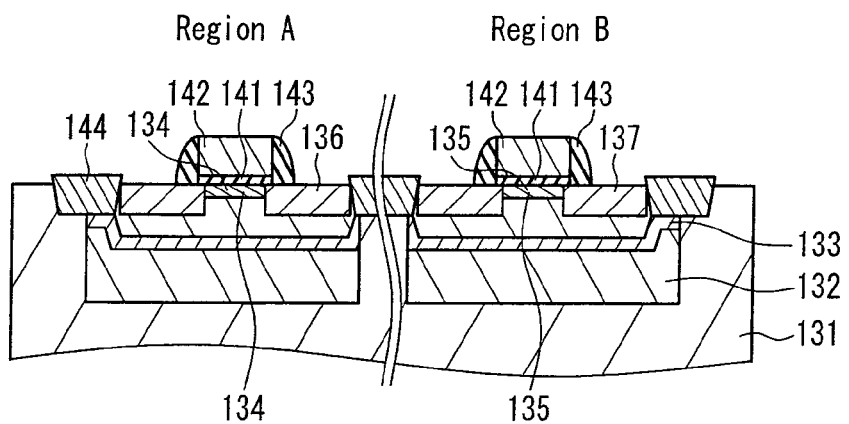
Figure 8G:
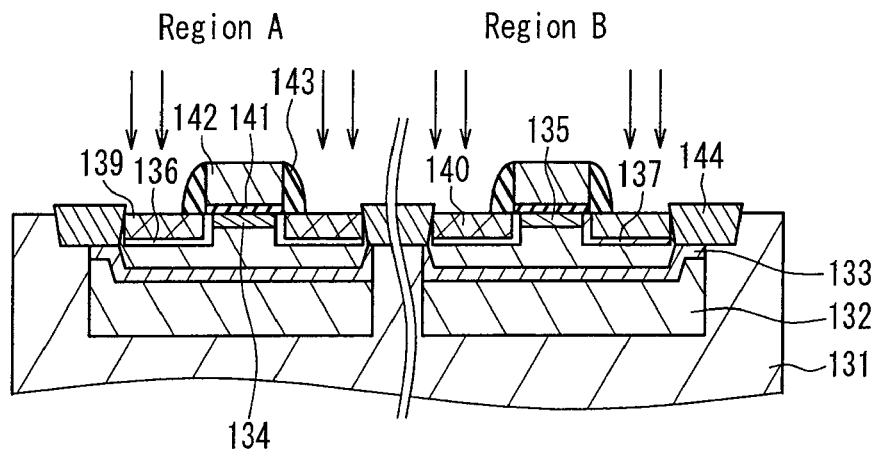
Figure 9:
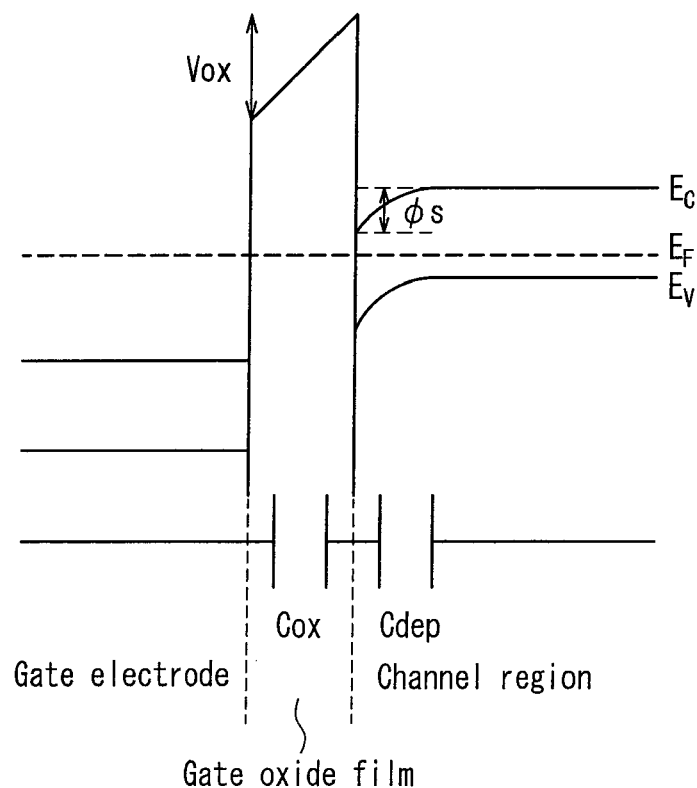
FIG. 9 is a band diagram showing depletion of a conventional MOS transistor.
Figure 10A:
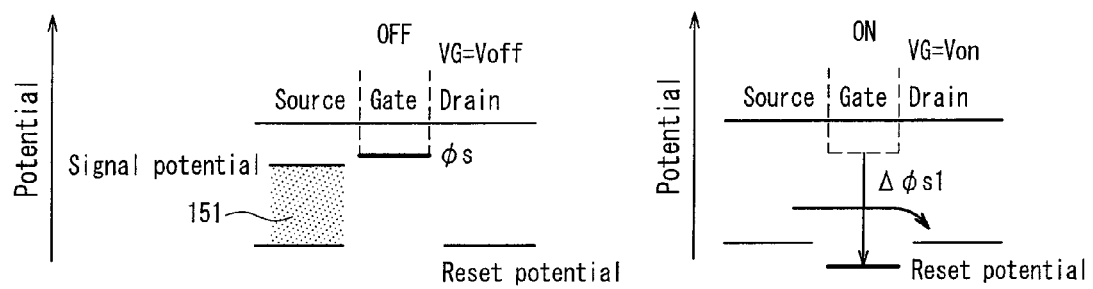
FIG. 10A is an energy diagram showing potentials of a source, a gate and a drain in the conventional transistor in a conducting mode and in a power cut-off mode, respectively.
Figure 10B:
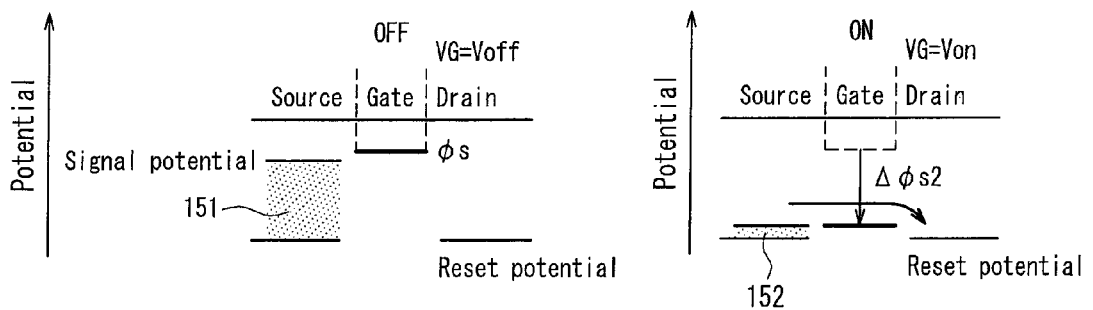
FIG. 10B is an energy diagram showing potentials of the source, the gate and the drain of a transistor having a lower modulation degree in the conducting mode and in the power cut-off mode, respectively.

FIG. 6 is a graph showing experimental results regarding a modulation degree and variation in the modulation degree of each of the above-described depletion type transistors that use, as the n-type impurity, phosphorus and arsenic, respectively. In FIG. 6, a horizontal axis indicates an implantation energy, and a vertical axis on the left indicates a modulation degree, while a vertical axis on the right indicates variations in the modulation degree. Values on the axis indicating the variations in the modulation degree are arbitrary.

In this experiment, a dose amount is set so that a depletion type transistor has a threshold voltage Vt=−1.60 V As implantation conditions (experimental conditions), phosphorus ions are implanted and an implantation energy is set to 35 keV for the conventional transistor, and arsenic ions are implanted and an implantation energy is set so as to vary between 50 keV and 130 keV for the transistor according to this embodiment.

FIG. 6 shows experimental results in which ■ indicates a modulation degree of the transistor in this embodiment, ♦ indicates a modulation degree of the conventional example, □ indicates variations in the modulation degree of the transistor in this embodiment, and ◇ indicates variations in the modulation degree of the conventional example. As the implantation energy increases, the modulation degree increases and the variations decrease. The variations described herein are expressed in terms of a standard deviation.

As can be seen from FIG. 6, with respect to every value of the implantation energy used in measurements, the transistor according to this embodiment is larger in modulation degree and smaller in variations in modulation degree than the transistor as the conventional example. Particularly, the transistor according to this embodiment has a modulation degree of 0.58 (a maximum value at an implantation energy of 50 keV) and thus achieves an about 1.29-fold increase compared with the conventional transistor having a modulation degree of 0.45 (at an implantation energy of 35 keV). Further, as for the variations in modulation degree, the transistor according to this embodiment has a value of 0.22 (a minimum value at an implantation energy of 50 keV) and thus achieves an about 0.37-fold suppression compared with the conventional transistor having a value of 0.6 (at an implantation energy of 35 keV).

That is, improvements in modulation degree and variations in modulation degree are achieved, and moreover, since a cause of the variations in the modulation degree is eliminated, variations in threshold voltage can be suppressed.

As described in the foregoing discussion, in the depletion type transistor in the integrated circuit according to this embodiment, the pocket implantation 10 is formed in a position deeper than a position of the LDD regions 6b and 7b, and thus the occurrence of punchthrough can be prevented. Further, as the n-type impurity, arsenic that is heavier than phosphorus is used, and thus a pn junction is formed in a position at a decreased depth, so that a high modulation degree is obtained and a reduction in variations in modulation degree is achieved. Thus, it is possible to reduce variations in threshold voltage.

Moreover, the use of the above-described transistor having a high modulation degree in a solid-stage imaging device allows the solid-state imaging device to have an increased dynamic range.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An integrated circuit, comprising:
    a semiconductor substrate that has a first well region and a second well region containing p-type impurity at a first concentration;
    an enhancement type MOS transistor formed in the first well region and having a first channel region under a first gate electrode; and
    a depletion type MOS transistor formed in the second well region and having a second channel region under a second gate electrode,
    wherein in a surface region of the first channel region, a first layer is formed that contains a p-type impurity at a second concentration,
    in a surface region of the second channel region, a second layer is formed that contains an n-type impurity at a third and a p-type impurity at a fourth concentration,
    the fourth concentration is the same as the first concentration and the second concentration is higher than the first concentration, and
    wherein in the second channel region, second p-type pocket implantation regions are provided under and directly contact the second layer; and in the first channel region, first p-type pocket implantation regions are provided under and directly contact the first layer.

2. A solid-state imaging device comprising an integrated circuit as claimed in claim 1.

3. The integrated circuit according to claim 1, wherein the n-type impurity contained in the second layer is phosphorus or arsenic.

4. The integrated circuit according to claim 1, wherein in the first and second channel regions, the first layer and the second layer are formed, respectively, in a surface region of the semiconductor substrate.

5. The solid-state imaging device according to claim 2, wherein in the first and second channel regions, the first layer and the second layer are formed, respectively, in a surface region of the semiconductor substrate.

6. The integrated circuit according to claim 1, wherein the p-type impurity contained in the first layer is boron.

7. The integrated circuit according to claim 1 further comprising, a first channel stop region formed in the first well region.

8. The integrated circuit according to claim 1 further comprising, a second channel stop region formed in the second welt region.

9. The integrated circuit according to claim 1 further comprising, a first sidewall formed on a side of the first gate electrode.

10. The integrated circuit according to claim 1 further comprising, a second sidewall formed on a side of the second gate electrode.

11. The integrated circuit according to claim 1 further comprising first LDD regions formed on sides of the first channel region, respectively.

12. The integrated circuit according to claim 1 further comprising, second LDD regions formed on sides of the second channel region, respectively.

13. The integrated circuit according to claim 11 further comprising, first source/drain regions formed on outsides of the rust LDD regions, respectively.

14. The integrated circuit according to claim 12 further comprising, second source/drain regions formed on outsides of the second LDD regions, respectively.

15. The integrated circuit according to claim 11, wherein in the first channel region, first p-type pocket implantation regions are provided under the first LDD regions.

16. The integrated circuit according to claim 12, wherein in the second channel region, second p-type pocket implantation regions are provided under the second LDD regions.

17. The integrated circuit according to claim 13, wherein in the first channel region, first p-type pocket implantation regions are provided under the first source/drain regions.

18. The integrated circuit according to claim 14, wherein in the second channel region, second p-type pocket implantation regions are provided under the second source/drain regions.

* * * * *